(12) United States Patent
Park et al.

(10) Patent No.: US 12,550,487 B2
(45) Date of Patent: Feb. 10, 2026

(54) ELECTRICALLY DRIVEN SINGLE-PHOTON EMITTER AND MANUFACTURING METHOD OF FABRICATING THE SAME

(71) Applicant: Korea University Research and Business Foundation, Seoul (KR)

(72) Inventors: Hong-Gyu Park, Seoul (KR); Jae-Pil So, Hanam-si (KR)

(73) Assignee: Korea University Research and Business Foundation, Seoul (KR)

( * ) Notice: Subject to any disclaimer, the term of this patent is extended or adjusted under 35 U.S.C. 154(b) by 459 days.

(21) Appl. No.: 18/159,260

(22) Filed: Jan. 25, 2023

(65) Prior Publication Data

US 2023/0317878 A1 Oct. 5, 2023

(30) Foreign Application Priority Data

Mar. 30, 2022 (KR) .................. 10-2022-0039382

(51) Int. Cl.
*H10H 20/821* (2025.01)
*H10H 20/01* (2025.01)
*H10H 20/822* (2025.01)
*H10H 20/832* (2025.01)
*H10H 20/84* (2025.01)

(52) U.S. Cl.
CPC .......... *H10H 20/821* (2025.01); *H10H 20/01* (2025.01); *H10H 20/822* (2025.01); *H10H 20/832* (2025.01); *H10H 20/84* (2025.01); *H10H 20/032* (2025.01); *H10H 20/034* (2025.01)

(58) Field of Classification Search
CPC .. H10H 20/821; H10H 20/822; H10H 20/832; H10H 20/812; H10H 20/01
See application file for complete search history.

(56) References Cited

U.S. PATENT DOCUMENTS

2019/0288160 A1 9/2019 Atature et al.
2021/0109127 A1 4/2021 Jonker et al.

FOREIGN PATENT DOCUMENTS

KR 10-2023-0000806 A 1/2023

OTHER PUBLICATIONS

Jae-Pil So, Hong-Gyu Park et al., Electrically driven straininduced deterministic single-photon emitters in a van der Waals heterostructure, Science Advances 7, eabj3176 (2021).
Jae-Pil So et al., Polarization Control of Deterministic Single-Photon Emitters in Monolayer WSe2, Nano Lett. 2021, 21, 1546? 1554.

(Continued)

*Primary Examiner* — Matthew L Reames
(74) *Attorney, Agent, or Firm* — Harness, Dickey & Pierce, P.L.C.

(57) ABSTRACT

Disclosed are electrically driven single-photon emitters and their fabrication methods. The single-photon emitter comprises a substrate, an active layer on the substrate, a spacer between the substrate and the active layer, a first electrode connected to the active layer, and a second electrode between the substrate and the spacer and vertically spaced apart from the active layer across the spacer. The substrate includes a deformable polymer. The substrate has a first dent where a portion of a top surface of the substrate is concavely recessed. The active layer has a second dent at a position which is aligned with the first dent and where a portion of a top surface of the active layer is concavely recessed.

18 Claims, 11 Drawing Sheets

(56) References Cited

OTHER PUBLICATIONS

S. Kumar et al., Strain-Induced Spatial and Spectral Isolation of Quantum Emitters in Mono- and Bilayer WSe2, Nano Lett. 15, 7567 (2015).
Artur Branny et al., Deterministic strain-induced arrays of quantum emitters in a two-dimensional semiconductor, Nat. Comm. 8, 15053 (2017).
Johannes Kern et al., Nanoscale Positioning of Single-Photon Emitters in Atomically Thin WSe2, Adv. Mater. 28, 7101 (2016).
Matthew R. Rosenberger et al., Quantum Calligraphy: Writing Single-Photon Emitters in a Two-imensional Materials Platform, ACS Nano 13, 904-912 (2019).
Carmen Palacios-Berraquero et al., Atomically thin quantum light-emitting diodes, Nat. Comm. 7, 12978 (2016).
Genevieve Clark et al., Single Defect Light-Emitting Diode in a van der Waals Heterostructure, Nano Lett. 16, 3944-3948 (2016).
S Schwarz et al., Electrically pumped single-defect light emitters in WSe2, 2D Mater. 3, 025038 (2016).
K. Barthelmi et al., Atomistic defects as single-photon emitters in atomically thin MoS2, Applied Physics Letters 117, 070501 (2020).

ELECTRICALLY DRIVEN SINGLE-PHOTON EMITTER AND MANUFACTURING METHOD OF FABRICATING THE SAME

CROSS-REFERENCE TO RELATED APPLICATION

This U.S. nonprovisional application claims priority under 35 U.S.C § 119 to Korean Patent Application No. 10-2022-0039382 filed on Mar. 30, 2022 in the Korean Intellectual Property Office, the disclosure of which is hereby incorporated by reference in its entirety.

BACKGROUND

The present inventive concepts relate to an electrically driven single-photon emitter, and more particularly, to an electrically driven deterministic single-photon emitter and a method of fabricating the same.

Quantum cryptography based on quantum mechanics has attracted attention as a solution to overcome eavesdropping of classical cryptography. A single-photon emitter is a basic core device in quantum cryptography and quantum communication. In particular, the development of quantum optical communication technology, such as quantum repeaters or quantum key distributions using single-photon emitters, is rapidly becoming a current essential application. Many recent studies have been conducted worldwide on research and development of the single-photon emitter using an atomically thin two-dimensional semiconductor material.

SUMMARY

Some embodiments of the present inventive concepts provide an electrically driven deterministic single-photon emitter and a method of fabricating the same.

An object of the present inventive concepts is not limited to the mentioned above, and other objects which have not been mentioned above will be clearly understood to those skilled in the art from the following description.

According to some embodiments of the present inventive concepts, an electrically driven single-photon emitter may comprise: a substrate; an active layer on the substrate; a spacer between the substrate and the active layer; a first electrode connected to the active layer; and a second electrode between the substrate and the spacer, the second electrode being vertically spaced apart from the active layer across the spacer. The substrate may include a deformable polymer. The substrate may have a first dent where a portion of a top surface of the substrate is concavely recessed. The active layer may have a second dent at a position which is aligned with the first dent and where a portion of a top surface of the active layer is concavely recessed.

In some embodiments, the active layer may include transition-metal dichalcogenide (TDMC) having a single atomic layer structure.

In some embodiments, the active layer may include tungsten diselenide ($WSe_2$).

In some embodiments, the spacer may include hexagonal boron nitride (h-BN).

In some embodiments, the first electrode and the second electrode may include graphene.

In some embodiments, a depth of the second dent may be in a range of about 10 nm to about 40 nm.

In some embodiments, the spacer may have a third dent at a position which is aligned with the first dent and the second dent and where a portion of a top surface of the spacer is concavely recessed. The second electrode may have a fourth dent at a position which is aligned with the first, second, and third dents and where a portion of a top surface of the second electrode is concavely recessed.

In some embodiments, the first electrode and the second electrode may be spaced apart from each other. At least a portion of the spacer may be in contact with the substrate.

In some embodiments, the aligned first and second dents may constitute an emitting point. The emitting point may be provided in plural. The emitting points may be spaced apart from each other.

In some embodiments, a value of second-order correlation function $g^{(2)}(0)$ at each of the emitting points may be equal to or less than about 0.5.

According to some embodiments of the present inventive concepts, a method of fabricating a electrically driven single-photon emitter may comprise: forming on a sacrificial substrate a heterostructure that includes a first electrode, an active layer, a spacer, and a second electrode; forming a polymer layer that covers the heterostructure; peeling the heterostructure and the polymer layer off from the sacrificial substrate; inverting and transferring the heterostructure and the polymer layer onto a first substrate; performing on the polymer layer an annealing process to form a second substrate on the first substrate; and using an atomic force microscope (AFM) to press a tip thereof against a central portion of the heterostructure. The step of pressing the central portion of the heterostructure may include forming a first dent on the second substrate and a second dent on the active layer.

In some embodiments, the first electrode and the second electrode may be formed of graphene. The first electrode and the second electrode may be formed by using a dry transfer method in which a graphene monolayer is transferred.

In some embodiments, the active layer may be formed of metal dichalcogenide (TDMC) having a single atomic layer structure. The spacer may be formed of hexagonal boron nitride (h-BN).

In some embodiments, the active layer and the spacer may each be peeled off by a mechanical exfoliation method and may be combined on the sacrificial substrate.

In some embodiments, the step of forming the heterostructure on the sacrificial substrate may include: transferring the first electrode onto the sacrificial substrate; forming on the sacrificial substrate the active layer in contact with the first electrode; forming the spacer that covers the active layer; and transferring the second electrode that covers the spacer.

In some embodiments, the polymer layer may be formed on the heterostructure in a spin coating method.

In some embodiments, the step of transferring the heterostructure and the polymer layer onto the first substrate may include performing a solution-based transfer method.

In some embodiments, the annealing process may allow the second substrate to have a flat top surface and a uniform composition.

In some embodiments, the AFM may press the tip against the central portion of the heterostructure with a force of about 1,000 nN to about 8,000 nN. A diameter of the tip of the AFM may be in a range of about 1 nm to about 20 nm.

In some embodiments, a depth of the second dent may be in a range of about 10 nm to about 40 nm.

DETAIL PARTED DESCRIPTION OF EMBODIMENTS

Figure 1:
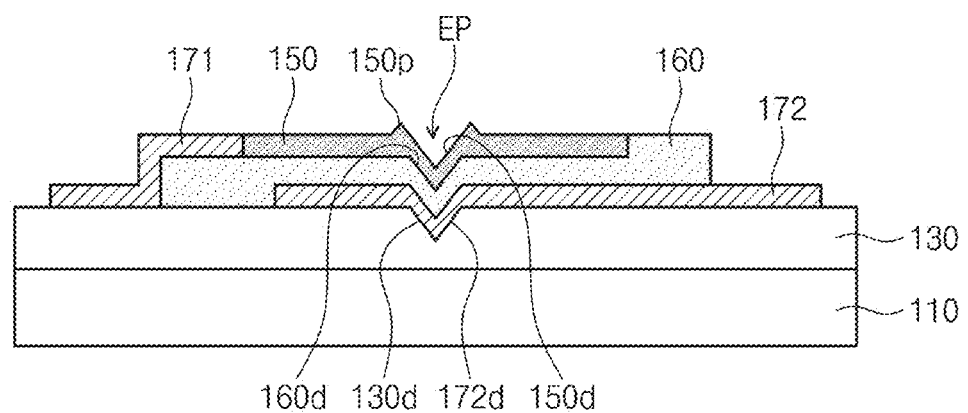
FIG. 1 illustrates a cross-sectional view showing an electrically driven single-photon emitter according to some embodiments of the present inventive concepts.

In order to sufficiently understand the configuration and effect of the present inventive concepts, embodiments of the present inventive concepts will be described with reference to the accompanying drawings.

It should be noted, however, that the present inventive concepts are not limited to the following exemplary embodiments, and may be implemented in various forms. Rather, the exemplary embodiments are provided only to disclose the present inventive concepts and let those skilled in the art fully know the scope of the present inventive concepts. In the accompanying drawings, each component may be exaggerated, up-scaled, or down-scaled in the interest of convenience of description.

The terminology used herein is for the purpose of describing particular embodiments only and is not intended to limit the present inventive concepts. Unless otherwise defined, all terms used herein have the same meaning as commonly understood by one of ordinary skill in the art to which the present inventive concepts belong.

As used herein, the singular forms are intended to include the plural forms as well. It will be understood that the terms "comprises", and/or "comprising" specify the presence of stated elements, steps, operations, and/or devices, but do not preclude the presence or addition of one or more other elements, steps, operations, and/or devices.

The terms "first", "second", and so forth are used in this disclosure to describe various regions, directions, and shapes, but none of which are limited by these terms. These terms are used only to distinguish a certain region, direction, or shape from another region, direction, or shape. Therefore, "a first section" discussed in one embodiment could be termed "a second section" in another embodiment. The some embodiments explained and illustrated herein include complementary embodiments thereof. Like reference numerals refer to like elements throughout the specification.

It will be discussed in detail below an electrically driven single-photon emitter and a method of fabricating the same according to some embodiments of the present inventive concepts in conjunction with the accompanying drawings.

FIG. 1 illustrates a cross-sectional view showing an electrically driven single-photon emitter according to some embodiments of the present inventive concepts.

Referring to FIG. 1, an electrically driven single-photon emitter according to the present inventive concepts may include a first substrate 110, a second substrate 130, an active layer 150, a spacer 160, a first electrode 171, and a second electrode 172.

The first substrate 110 may be a semiconductor substrate including at least one selected from silicon, germanium, and silicon-germanium, a silicon-on-insulator (SOI) substrate, a compound semiconductor substrate, a glass substrate, or a plastic substrate.

The second substrate 130 may be provided on the first substrate 110. The second substrate 130 may cover a top surface of the first substrate 110. The second substrate 130 may include a deformable polymer. The second substrate 130 may include, for example, polymethyl methacrylate (PMMA). The second substrate 130 may have a first dent 130d. The first dent 130d may be defined as a site where a top surface of the second substrate 130 is partially and concavely recessed (e.g., in a direction toward the first substrate 110).

The active layer 150 may be provided on the second substrate 130. The active layer 150 may include transition-metal dichalcogenide (TDMC) having a single atomic layer structure. For example, the active layer 150 may include tungsten diselenide ($WSe_2$). The active layer 150 may have a thickness of about 0.1 nm to about 1 nm. The active layer 150 may have a second dent 150d. The second dent 150d may be defined as a site where a top surface of the active layer 150 is partially and concavely recessed. The second dent 150d may be vertically (in a vertical view) and horizontally (in a plan view) aligned with the first dent 130d of the second substrate 130.

According to some embodiments, the active layer 150 may include protrusions 150p positioned on opposite sides of the second dent 150d. The top surface of the active layer 150 may have portions that convexly protrude (e.g., in a direction away from the first substrate 110), and the protrusions 150p may be defined as the portions of the active layer 150.

The second dent 150d may have a depth of, for example, about 10 nm to about 40 nm. The depth of the second dent 150d may be defined as a difference in level between a lowermost point of the second dent 150d and the top surface of the active layer 150 (e.g., an uppermost point of the protrusions 150p in a case where the protrusions 150p are included).

The spacer 160 may be provided between the second substrate 130 and the active layer 150. The spacer 160 may include a dielectric material. For example, the spacer 160 may include hexagonal boron nitride (h-BN). The spacer 160 may have a thickness of about 1 nm to about 10 nm. The spacer 160 may have a third dent 160d. The third dent 160d may be defined as a site where a top surface of the spacer 160 is partially and concavely recessed. The active layer 150 may fill at least a portion of the third dent 160d. The active layer 150 may cover an inner wall of the third dent 160d. The third dent 160d may be vertically and horizontally aligned with the first dent 130d and the second dent 150d. At least a portion of the spacer 160 may be in contact with the top surface of the second substrate 130.

The first electrode 171 may be provided to connect with the active layer 150, and the second electrode 172 may be provided to lie between the second substrate 130 and the spacer 160. The first electrode 171 and the second electrode 172 may include a conductive material. The first electrode 171 and the second electrode 172 may include, for example, graphene. Each of the first and second electrodes 171 and 172 may have a thickness of about 0.1 nm to about 1 nm.

The first electrode 171 may extend in a first direction from one sidewall of the active layer 150. For example, the first electrode 171 may cover a top surface and a sidewall of the spacer 160, and may extend along the top surface of the second substrate 130.

The second electrode 172 may extend in a second direction opposite to the first direction, while covering the top surface of the second substrate 130. The second electrode 172 may fill at least a portion of the first dent 130d. The second electrode 172 may cover an inner wall of the first dent 130d. The second electrode 172 may be vertically and/or horizontally spaced apart from the first electrode 171.

The second electrode 172 may be vertically spaced apart from the active layer 150 across the spacer 160.

The second electrode 172 may have a fourth dent 172d. The fourth dent 172d may be defined as a site where a portion of the second electrode 172 is concavely recessed. The spacer 160 may fill at least a portion of the fourth dent 172d. The spacer 160 may cover an inner wall of the fourth dent 172d. The fourth dent 172d may be vertically and horizontally aligned with the first, second, and third dents 130d, 150d, and 160d.

The active layer 150, the spacer 160, the first electrode 171, and the second electrode 172 may constitute a heterostructure. For example, each of junctions between the active layer 150, the spacer 160, the first electrode 171, and the second electrode 172 may be a van der Waals heterojunction where a strong interaction between light and material is generated at an interface between ones of the active layer 150, the spacer 160, the first electrode 171, and the second electrode 172.

An emitting point EP may be defined to indicate the first, second, third, and fourth dents 130d, 150d, 160d, and 172d that are aligned with each other or overlap each other. The active layer 150 may have a band diagram that is deformed into a funnel shape due to the second dent 150d (or due to strain caused by the second dent 150d). When a bias voltage greater than a certain value is provided between the first and second electrodes 171 and 172, the Fermi level (EF) of the first electrode 171 may increase above the conduction band edge of the active layer 150. In this case, a tunneling current may occur through the spacer 160, and electron-hole pair traps may induce single-photon emission from the emitting point EP. The single-photon emission may be created by a localized defect exciton activated with local strain of the emitting point EP. When a higher bias voltage is applied between the first and second electrodes 171 and 172, a tunneling current may also occur at points other than the emitting point EP to emit photons (or to act as a light-emitting diode).

According to some embodiments, a plurality of emitting points EP may be provided on the first substrate 110. The plurality of emitting points EP may be spaced apart from each other, and may have different depths or diameters, but have substantially the same structure. According to some embodiments, the plurality of emitting points EP may be disposed in an array fashion on the first substrate 110.

A single-photon emitter according to the present inventive concepts may be a deterministic quantum light source capable of controlling a single-photon generation position. In addition, a single-photon emitter according to the present inventive concepts may use an electrical drive control, and thus without optical pumping, may be easily combined with optical devices such as optical resonators. Moreover, a single-photon emitter according to the present inventive concepts may include a heterostructure of a two-dimensional material, and may therefore be applicable to various devices such as transistors, photodetectors, piezoelectric devices, and memory devices.

FIGS. 2 to 6 illustrate cross-sectional views showing a method of fabricating an electrically driven single-photon emitter according to some embodiments of the present inventive concepts. With reference to FIGS. 2 to 6, the following will describe in detail a method of fabricating the electrically driven single-photon emitter discussed with reference to FIG. 1.

Figure 2:
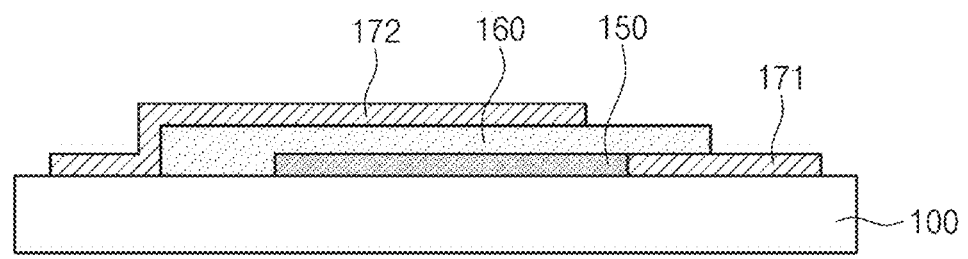
FIGS. 2 to 6 illustrate cross-sectional views showing a method of fabricating an electrically driven single-photon emitter according to some embodiments of the present inventive concepts.

Referring to FIG. 2, a first electrode 171, an active layer 150, a spacer 160, and a second electrode 172 may be sequentially formed on a sacrificial substrate 100. Each of the first electrode 171 and the second electrode 172 may be formed by, for example, a dry transfer method in which a graphene monolayer grown on a separate film is transferred. The active layer 150 and the spacer 160 may each be peeled off by a mechanical exfoliation method and may be combined on the sacrificial substrate 100.

For example, the formation of the first electrode 171, the active layer 150, the spacer 160, and the second electrode 172 on the sacrificial substrate 100 may include transferring the first electrode 171 on the sacrificial substrate 100, forming on the sacrificial substrate 100 the active layer 150 in contact with the first electrode 171, forming the spacer 160 that covers the active layer 150, and transferring the second electrode 172 that covers the spacer 160.

Figure 3:
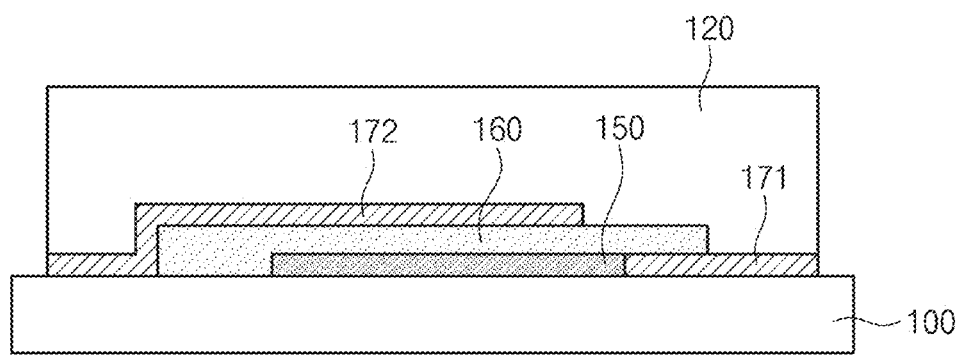

Referring to FIG. 3, a polymer layer 120 may be formed to cover a heterostructure including the first electrode 171, the active layer 150, the spacer 160, and the second electrode 172 that are formed on the sacrificial substrate 100. A spin coating method may be employed to form the polymer layer 120 on the heterostructure.

Figure 4:
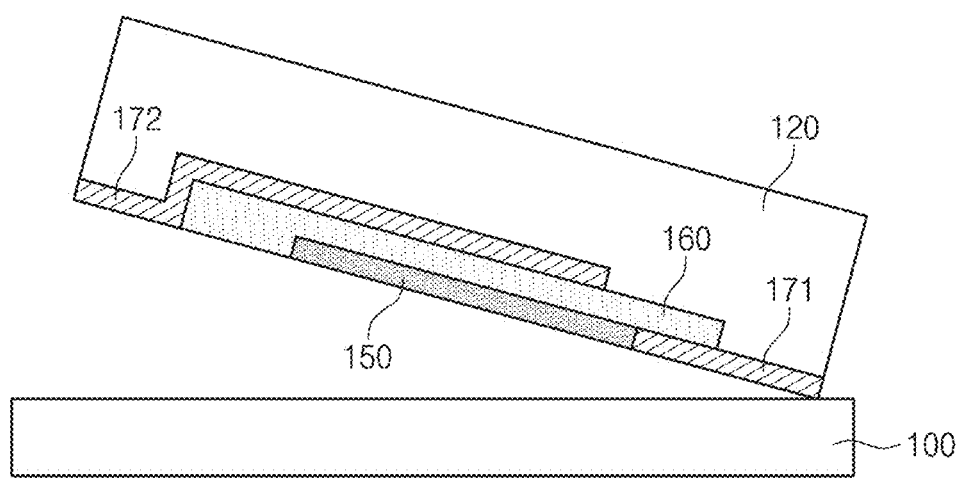
Figure 5:
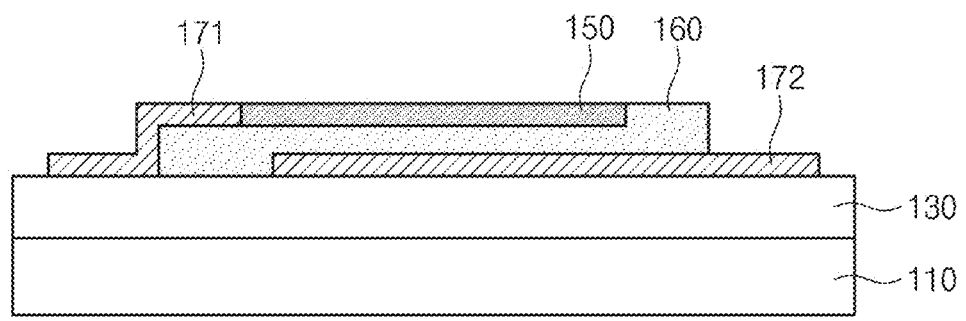

Referring to FIGS. 4 and 5, the heterostructure and the polymer layer 120 may be peeled off from the sacrificial substrate 100, and may be transferred onto a first substrate 110 while being turned upside down or inverted. The transfer of the heterostructure and the polymer layer 120 may be achieved by a solution-based transfer method or a water-assisted pickup method. Afterwards, the polymer layer 120 may undergo an annealing process performed at about 120° to form a second substrate 130 having a flat top surface and a uniform composition.

Figure 6:
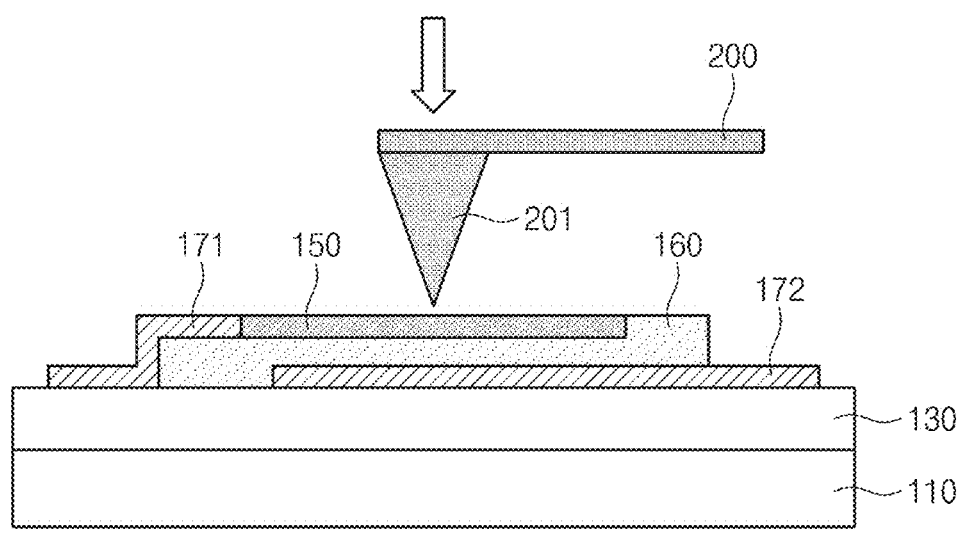

Referring to FIG. 6, an atomic force microscope (AFM) 200 may be used to press a tip 201 thereof against a central portion of the active layer 150, or a central portion of the heterostructure. Referring back to FIG. 1 together with FIG. 6, first, second, third, and fourth dents 130d, 150d, 160d, and 172d (or an emitting point EP) may be formed on a position against which the AFM 200 presses the tip 201. The tip 201 of the AFM 200 may exert on the active layer 150 a force of about 1,000 nN to about 8,000 nN. The tip 201 of the AFM 200 may have a diameter of, for example, about 1 nm to about 20 nm.

FIGS. 7 to 17 illustrate graphs (or pictures) showing properties of an electrically driven single-photon emitter according to some embodiments of the present inventive concepts.

Figure 7:
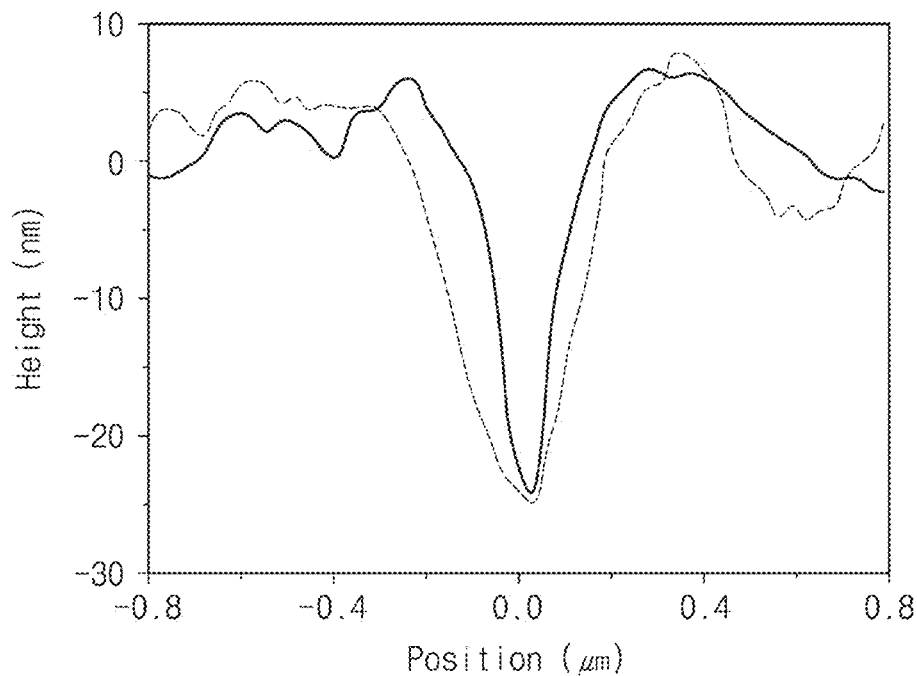
FIGS. 7 to 17 illustrate graphs (or pictures) showing properties of an electrically driven single-photon emitter according to some embodiments of the present inventive concepts.
Figure 8:
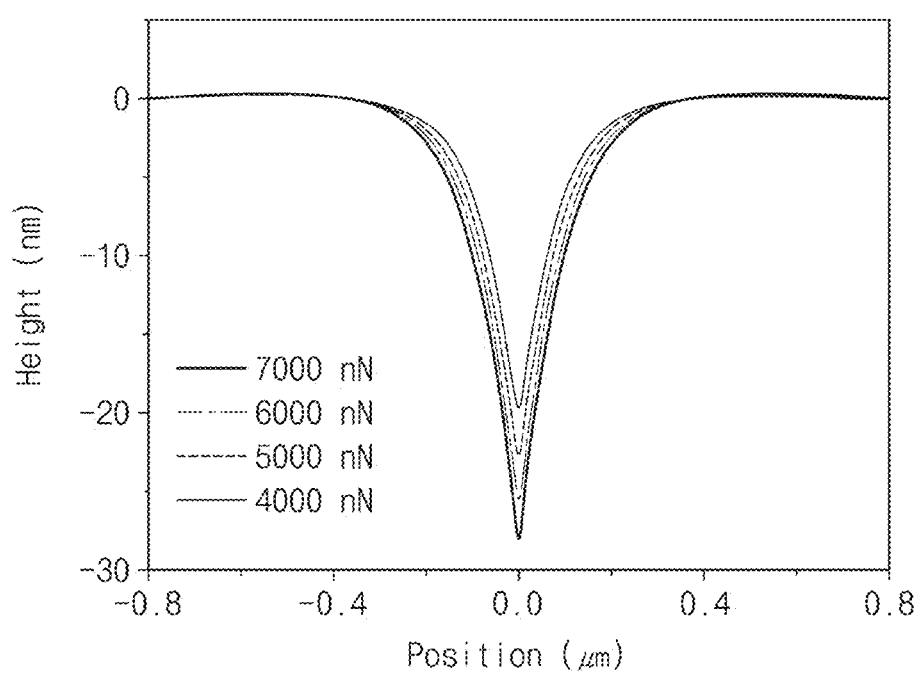
Figure 9:
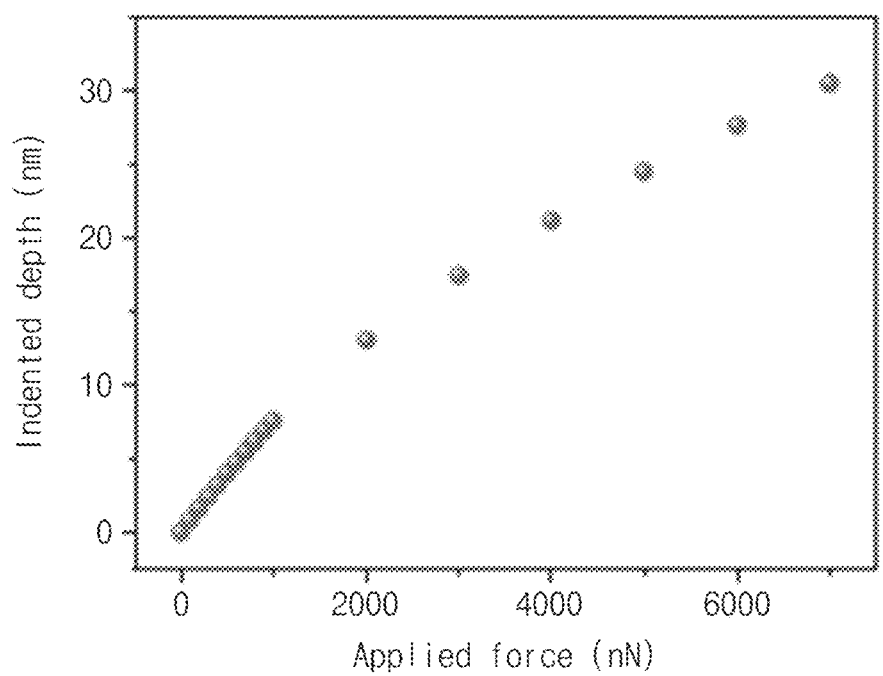

FIGS. 7 and 8 illustrate graphs showing a profile at the top surface of the active layer 150 in an electrically driven single-photon emitter according to some embodiments of the present inventive concepts. In FIGS. 7 and 8, a horizontal axis may have a unit of μm, and a vertical axis may have a unit of nm. FIG. 9 illustrates a graph showing an indented depth as a function of applied force. In FIG. 9, a horizontal axis may indicate an applied force whose unit is nN, and a vertical axis may denote an indented depth whose unit is nm.

Referring to FIG. 7 together with FIG. 1, the active layer 150 may have a dent structure (or the second dent 150d) at the emitting point EP (or at a position of 0.0), and the second dent 150d may have a depth of about 10 nm to about 40 nm, but the profile may be changed to some extent in accordance with some embodiments.

Referring to FIG. 8 together with FIG. 6, an increase in force applied by the tip 201 of the AFM 200 may cause an increase in depth of the second dent 150d of the active layer 150. FIG. 8 shows a profile at the top surface of the active layer 150 in cases where the AFM 200 presses the tip 201 against the active layer 150 with forces of about 4,000 nN, about 5,000 nN, about 6,000 nN, and about 7,000 nN.

Referring to FIG. 9 together with FIG. 6, as discussed with reference to FIG. 8, an increase in force applied by the tip 201 of the AFM 200 may cause an increase in depth of the second dent 150d of the active layer 150. An increase in force applied when the AFM 200 presses the tip 201 against the active layer 150 may induce a reduction in slope of the graph depicted in FIG. 9.

Figure 10:
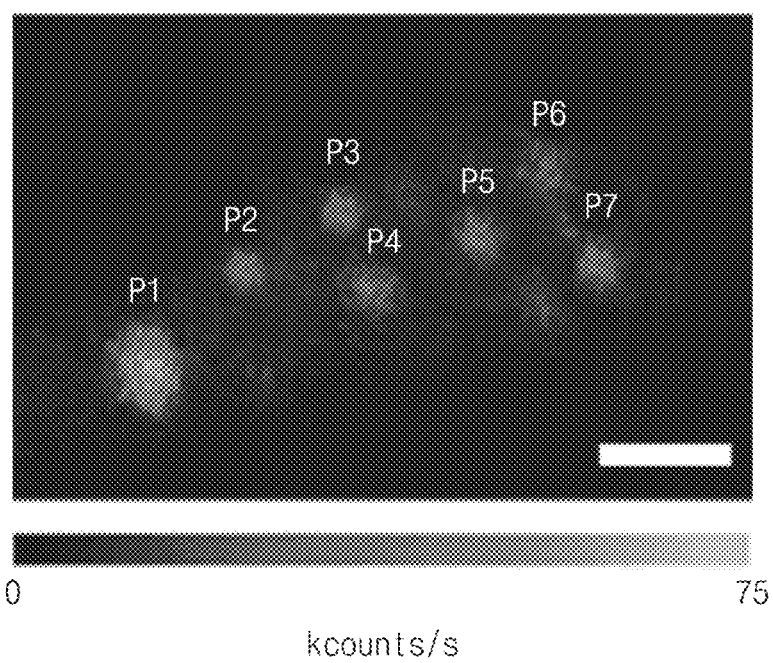
Figure 11:
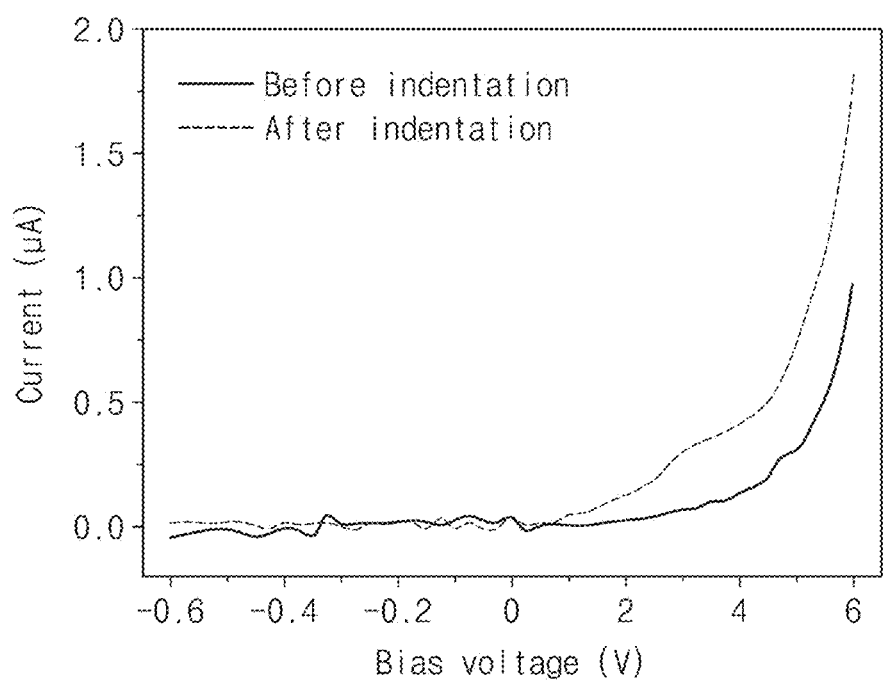
Figure 12:
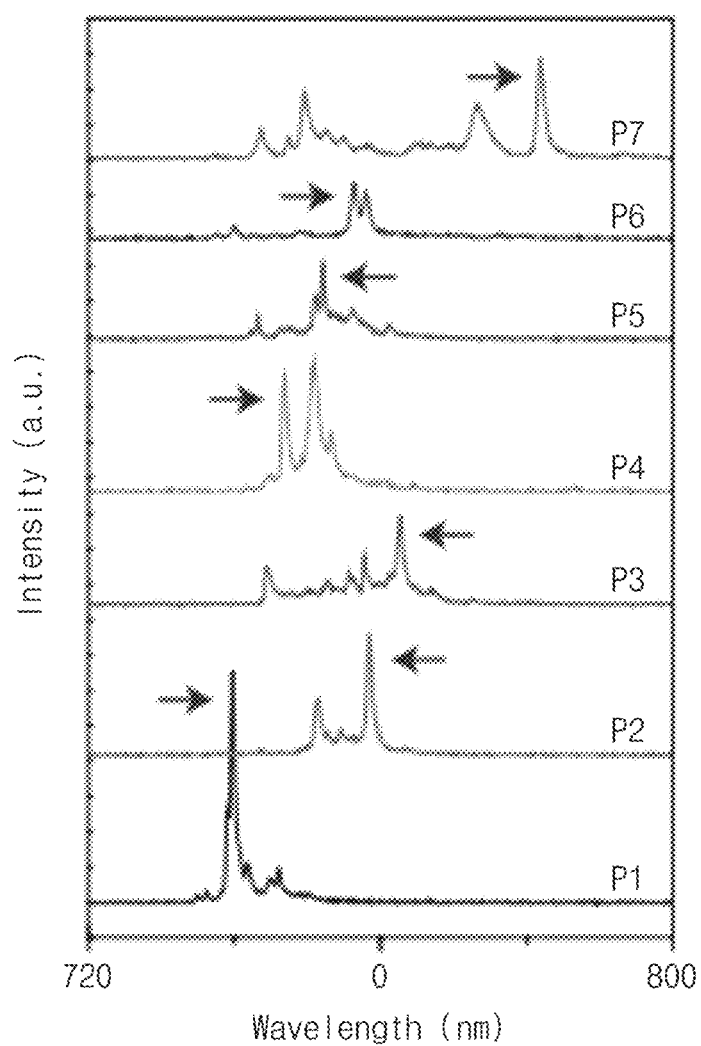
Figure 13:
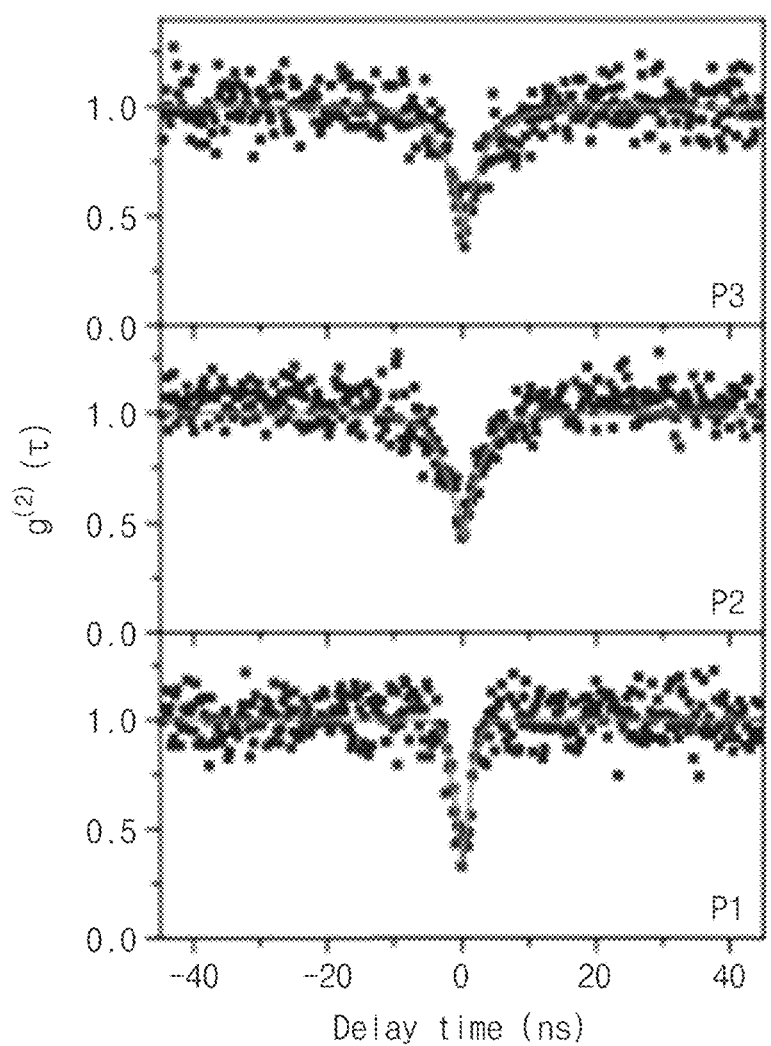

FIG. 10 illustrates imaged intensity of electro-luminescence (EL) of photons emitted from an electrically driven single-photon emitter including a plurality of emitting points P1 to P7. The scale bar of FIG. 10 may be about 2 μm. FIG. 11 illustrates a graph showing a relationship between tunneling current and bias voltage applied to an electrically driven single-photon emitter. In FIG. 11, a horizontal axis may indicate a bias voltage whose unit is V, and a vertical axis may denote a current whose unit is μA. FIG. 12 illustrates a graph showing electro-luminescence spectra at the emitting points P1 to P7. In FIG. 12, a horizontal axis may indicate a wavelength whose unit is nm, and a vertical axis may denote a spectral intensity. FIG. 13 illustrates a graph showing a second-order correlation function $g^{(2)}(\tau)$ of delay time (whose unit is ns) at some of the emitting points P1 to P7 depicted in FIG. 10. FIGS. 10, 12, and 13 show data measured at a bias voltage of about 2.0 V.

Referring to FIG. 11, a tunneling current may flow only when a bias voltage is applied which is greater than a certain value (e.g., about 2.0 V). In addition, referring to FIG. 11, it may be found that there is a difference between before and after indentation where the AFM 200 presses the tip 201 against the active layer 150 as discussed with reference to FIG. 6. FIG. 10 shows a state after indentation where the AFM 200 presses the tip 201 against the active layer 150. At the same bias voltage, a magnitude of tunneling current may be greater after indentation than before indentation.

Referring to FIGS. 10 and 12, electro-luminescence spectra at first to seventh emitting points P1 to P7 may have their peak wavelengths within a range of about 735 nm to about 785 nm. The electro-luminescence spectra at the first to seventh emitting points P1 to P7 may have their peak wavelengths different from each other. The difference in peak wavelength between emitting points may be caused by the fact that there is a difference in the degree to which a bandgap of the active layer 150 is deformed due to local strain between emitting points.

Referring to FIGS. 10 and 13, values of $g^{(2)}(0)$ at the first, second, and third emitting points P1, P2, and P3 may be equal to or less than about 0.5. For example, the value of $g^{(2)}(0)$ at the first emitting point P1 may be about 0.298, the value of $g^{(2)}(0)$ at the second emitting point P2 may be about 0.396, and the value of $g^{(2)}(0)$ at the third emitting point P3 may be about 0.353. The situation that the value is equal to or less than about 0.5 may mean that an emitting point exhibits single-photon properties (or, a single photon is emitted at a single time). For example, the first, second, and third emitting points P1, P2, and P3 may exhibit single-photon properties.

Figure 14:
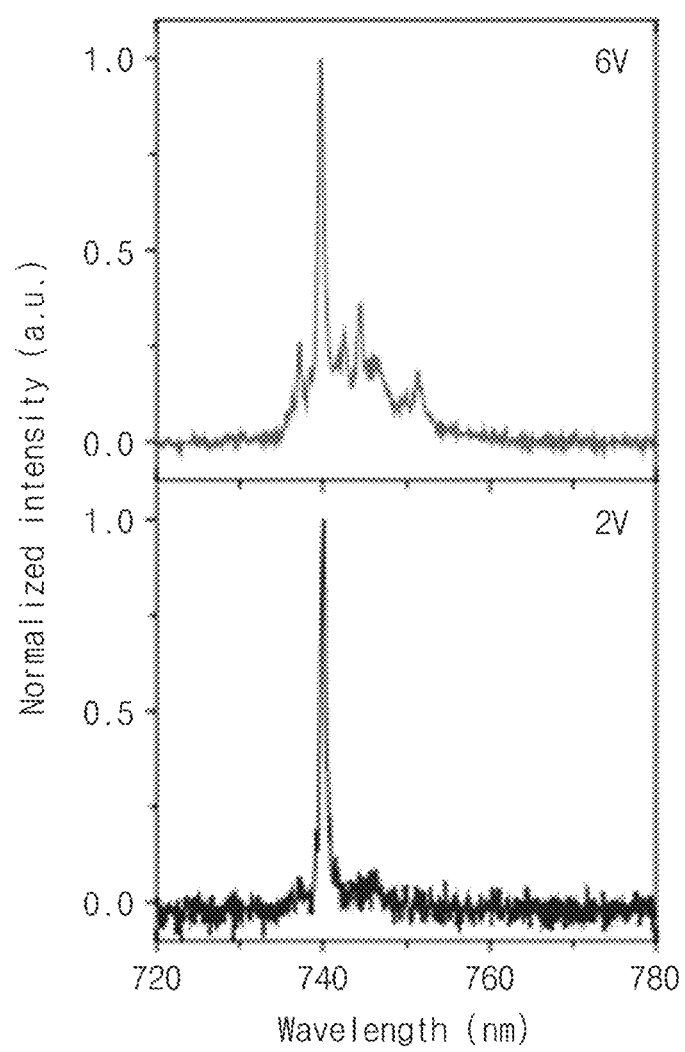
Figure 15:
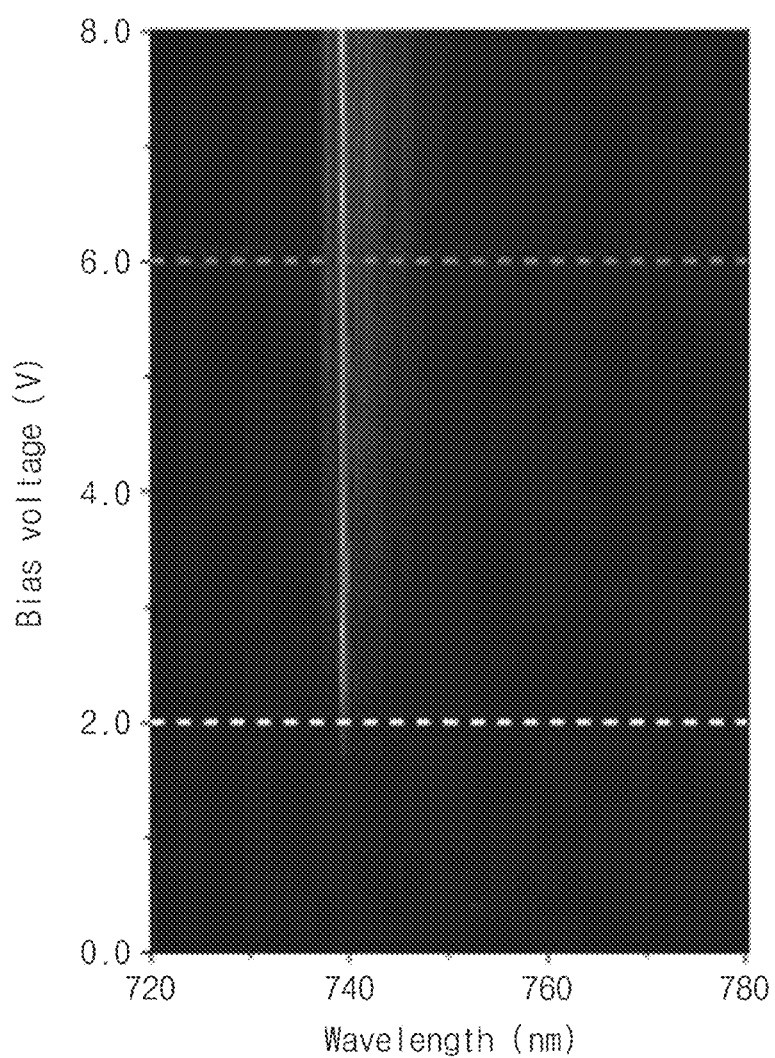
Figure 16:
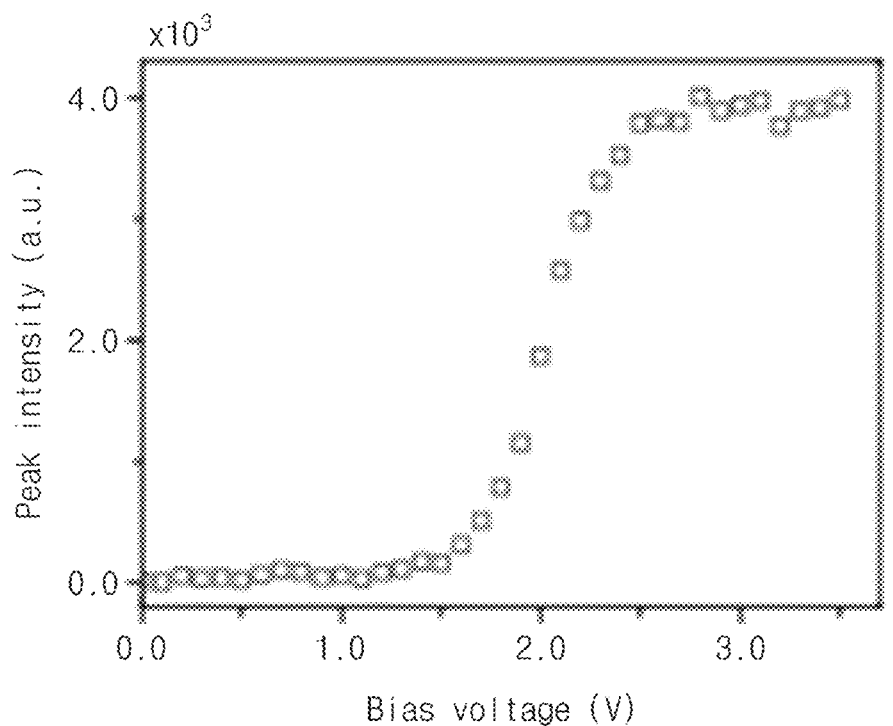
Figure 17:
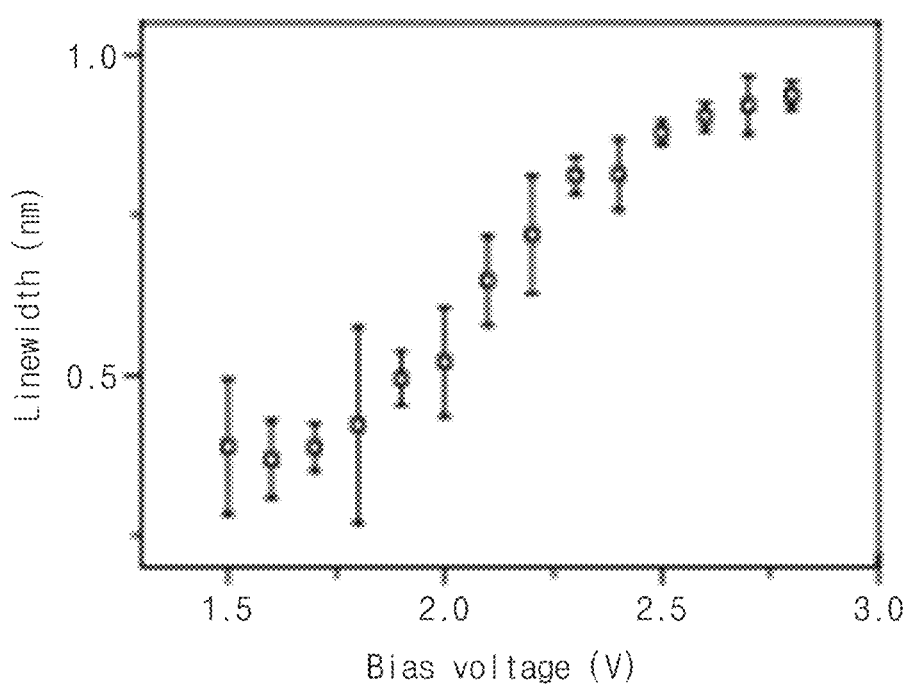

FIG. 14 illustrates a graph showing electro-luminescence spectra based on a magnitude of bias voltage. In FIG. 14, a horizontal axis may indicate a wavelength whose unit is nm, and a vertical axis may denote a normalized spectral intensity. FIG. 15 illustrates imaged electro-luminescence based on a difference in magnitude of bias voltage. In FIG. 15, a horizontal axis may indicate a wavelength whose unit is nm, and a vertical axis may indicate a bias voltage whose unit is V. FIG. 16 illustrates a graph showing a relationship between bias voltage and peak. FIG. 17 illustrates a graph showing a relationship between bias voltage and line-width. In FIGS. 16 and 17, a horizontal axis may indicate a bias voltage whose unit is V. In FIG. 17, a vertical axis may denote a line-width whose unit is nm.

The graph of FIG. 14 may be plotted obtained in cases where bias voltages are about 2.0 V and about 6.0 V. When a bias voltage is about 6.0 V, relatively high electro-luminescence may occur at or around a peak wavelength. Referring to FIGS. 14 and 15, when a higher bias voltage is applied, a tunneling current may also occur at points other than an emitting point to thereby emit photons. In addition, referring to FIG. 15, electro-luminescence may occur when a bias voltage is applied which is greater than a certain value (e.g., about 2.0 V). Referring to FIGS. 16 and 17, an increase in bias voltage may cause an increase in peak intensity and peak line-width.

A single-photon emitter according to the present inventive concepts may be a deterministic quantum light source capable of controlling a single-photon generation position.

In addition, a single-photon emitter according to the present inventive concepts may use an electrical drive control, and thus without optical pumping, may be easily combined with optical devices such as optical resonators.

Moreover, a single-photon emitter according to the present inventive concepts may include a heterostructure of a two-dimensional material, and may therefore be applicable to various devices such as transistors, photodetectors, piezo-electric devices, and memory devices.

Although the present inventive concepts have been described in connection with the some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. An electrically driven single-photon emitter, comprising:
    a substrate;
    an active layer on the substrate;
    a spacer between the substrate and the active layer;
    a first electrode directly contacting the active layer; and
    a second electrode between the substrate and the spacer,
      the second electrode being vertically spaced apart from the active layer across the spacer,
    wherein the substrate includes a deformable polymer,
    wherein the substrate has a first dent where a portion of a top surface of the substrate is concavely recessed,
    wherein the active layer has a second dent at a position which is aligned with the first dent and where a portion of a top surface of the active layer is concavely recessed, and
    wherein the top surface of the active layer is exposed from the spacer and the first electrode.

2. The single-photon emitter of claim 1, wherein the active layer includes transition-metal dichalcogenide (TMDC) having a single atomic layer structure.

3. The single-photon emitter of claim 2, wherein the active layer includes tungsten diselenide ($WSe_2$).

4. The single-photon emitter of claim 1, wherein the spacer includes hexagonal boron nitride (h-BN).

5. The single-photon emitter of claim 1, wherein the first electrode and the second electrode include graphene.

6. The single-photon emitter of claim 1, wherein a depth of the second dent is in a range of about 10 nm to about 40 nm.

7. The single-photon emitter of claim 1, wherein
the spacer has a third dent at a position which is aligned with the first dent and the second dent and where a portion of a top surface of the spacer is concavely recessed, and
the second electrode has a fourth dent at a position which is aligned with the first, second, and third dents and where a portion of a top surface of the second electrode is concavely recessed.

8. The single-photon emitter of claim 1, wherein
the first electrode and the second electrode are spaced apart from each other, and
at least a portion of the spacer is in contact with the substrate.

9. A method of fabricating an electrically driven single-photon emitter, the method comprising:
forming on a sacrificial substrate a heterostructure that includes a first electrode, an active layer, a spacer, and a second electrode;
forming a polymer layer that covers the heterostructure;
peeling the heterostructure and the polymer layer off from the sacrificial substrate;
inverting and transferring the heterostructure and the polymer layer onto a first substrate;
performing on the polymer layer an annealing process to form a second substrate on the first substrate; and
using an atomic force microscope to press a tip of the atomic force microscope against a central portion of the heterostructure,
wherein pressing the central portion of the heterostructure includes forming a first dent on the second substrate and a second dent on the active layer.

10. The method of claim 9, wherein
the first electrode and the second electrode are formed of graphene, and
the first electrode and the second electrode are formed by using a dry transfer method in which a graphene monolayer is transferred.

11. The method of claim 9, wherein
the active layer is formed of metal dichalcogenide (TMDC) having a single atomic layer structure, and
the spacer is formed of hexagonal boron nitride (h-BN).

12. The method of claim 11, wherein the active layer and the spacer are each peeled off by a mechanical exfoliation method and are combined on the sacrificial substrate.

13. The method of claim 9, wherein forming the heterostructure on the sacrificial substrate includes:
transferring the first electrode onto the sacrificial substrate;
forming on the sacrificial substrate the active layer in contact with the first electrode;
forming the spacer that covers the active layer; and
transferring the second electrode that covers the spacer.

14. The method of claim 9, wherein the polymer layer is formed on the heterostructure in a spin coating method.

15. The method of claim 9, wherein transferring the heterostructure and the polymer layer onto the first substrate includes performing a solution-based transfer method.

16. The method of claim 9, wherein the annealing process allows the second substrate to have a flat top surface and a uniform composition.

17. The method of claim 9, wherein
the atomic force microscope presses the tip against the central portion of the heterostructure with a force of about 1,000 nN to about 8,000 nN, and
a diameter of the tip of the atomic force microscope is in a range of about 1 nm to about 20 nm.

18. The method of claim 9, wherein a depth of the second dent is in a range of about 10 nm to about 40 nm.

* * * * *